(12) United States Patent
Ramsbey et al.

(10) Patent No.: US 7,256,141 B1
(45) Date of Patent: Aug. 14, 2007

(54) INTERFACE LAYER BETWEEN DUAL POLYCRYSTALLINE SILICON LAYERS

(75) Inventors: Mark T. Ramsbey, Sunnyvale, CA (US); Weidong Qian, Sunnyvale, CA (US); Mark Chang, Los Altos, CA (US); Eric Paton, Morgan Hill, CA (US)

(73) Assignees: Advanced Micro Devices, Inc., Sunnyvale, CA (US); Spansion LLC, Sunnyvale, CA (US)

( * ) Notice: Subject to any disclaimer, the term of this patent is extended or adjusted under 35 U.S.C. 154(b) by 134 days.

(21) Appl. No.: 11/135,492

(22) Filed: May 24, 2005

(51) Int. Cl.
*H01L 21/31* (2006.01)

(52) U.S. Cl. .................. 438/761; 438/625; 438/655; 438/653; 257/E21.582

(58) Field of Classification Search .................. None
See application file for complete search history.

(56) References Cited

U.S. PATENT DOCUMENTS

| | | | | |
|---|---|---|---|---|
| 4,398,335 A | * | 8/1983 | Lehrer | 438/625 |
| 5,043,300 A | * | 8/1991 | Nulman | 438/655 |
| 5,861,340 A | * | 1/1999 | Bai et al. | 438/592 |

* cited by examiner

*Primary Examiner*—Michael Lebentritt
*Assistant Examiner*—Kyoung Lee
(74) *Attorney, Agent, or Firm*—Harrity Snyder LLP (57) ABSTRACT

A structure interfaces dual polycrystalline silicon layers. The structure includes a first layer of polycrystalline silicon and a metal interface layer formed on a surface of the first layer of polycrystalline silicon. The structure further includes a second layer of polycrystalline silicon formed on a surface of the interface layer.

11 Claims, 6 Drawing Sheets

INTERFACE LAYER BETWEEN DUAL POLYCRYSTALLINE SILICON LAYERS

TECHNICAL FIELD

The present invention relates generally to semiconductor devices and, more particularly, to fabricating an interface layer between dual polycrystalline silicon layers in semiconductor devices.

BACKGROUND ART

Figure 1:
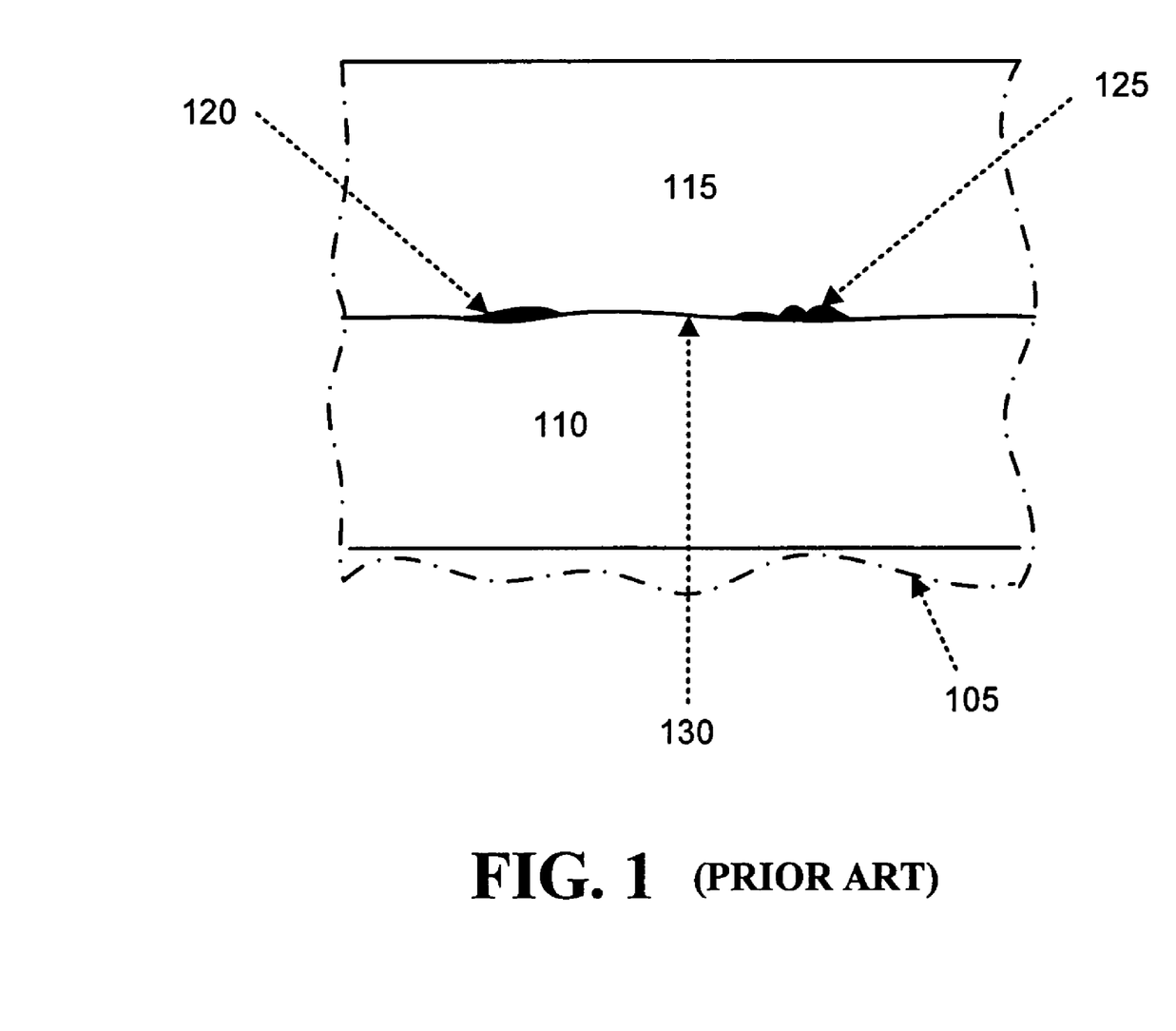
FIG. 1 illustrates the formation of dual polycrystalline silicon layers consistent with existing formation processes.

Dual polycrystalline silicon layers may be formed adjacent one another in various different types of semiconductor devices, including, for example, certain types of non-volatile memory devices. As shown in FIG. 1, formation of dual polycrystalline silicon layers typically involves the deposition of a first polycrystalline silicon layer 110 on an underlying layer 105 and then optional processing (not shown) of layer 110 to form various device structures (e.g., gates, etc.). Layer 110 may then be cleaned in an attempt to remove oxides and impurities, followed by an optional anneal at a high temperature to attempt to further remove oxides on layer 110. A second polycrystalline silicon layer 115 may then be deposited over layer 110. The cleaning and annealing processes, however, may not remove all oxides and impurities at the surface of layer 110, and residual oxide clusters 120 may be present on the surface of layer 110 prior to deposition of layer 115, thus, causing an imperfect interface 130 between polycrystalline silicon layers 110 and 115.

In the case wherein layer 110 is processed to produce a gate structure prior to formation of the second polycrystalline silicon layer, dopants for the gate are typically implanted into the top of the gate (i.e., into the upper surface of layer 110). In some circumstances, the dopants may cluster 125 at the surface of layer 110, thus, creating an undesirable depletion region at the interface 130 between layers 110 and 115.

DISCLOSURE OF THE INVENTION

According to an aspect of the invention, a method may include forming a first layer of polycrystalline silicon and cleaning a surface of the first layer. The method may further include forming an interface layer over the surface of the first layer, where the interface layer comprises a metal or alloy that can react with a silicon to form a silicide. The method may also include forming a second layer of polycrystalline silicon over the interface layer.

According to another aspect of the invention, a method of forming an interface between dual polycrystalline silicon layers may include forming a first layer of polycrystalline silicon. The method may further include forming a metal interface layer on the first layer of polycrystalline silicon and forming a second layer of polycrystalline silicon on the metal interface layer.

According to a further aspect of the invention, a structure for interfacing dual polycrystalline silicon layers may include a first layer of polycrystalline silicon having a first surface. The structure may further include a metal interface layer formed on the first surface of the first layer of polycrystalline silicon, the metal interface layer having a second surface and having a thickness ranging from about 10 Å to about 500 Å. The structure may also include a second layer of polycrystalline silicon formed on the second surface of the interface layer.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Consistent with aspects of the invention, an interface layer may be formed between dual polycrystalline silicon layers when fabricating one or more semiconductor devices. The interface layer may include titanium, cobalt or nickel and, via a thermal cycling process, may be reacted with the polycrystalline silicon layers to produce silicide regions between the interface layer and each polycrystalline silicon layer. The interface layer, thus, provides an improved bond between the dual polycrystalline silicon layers that further has an improved electrical contact as compared to existing polysilicon-to-polysilicon interfacing techniques.

Figure 2:
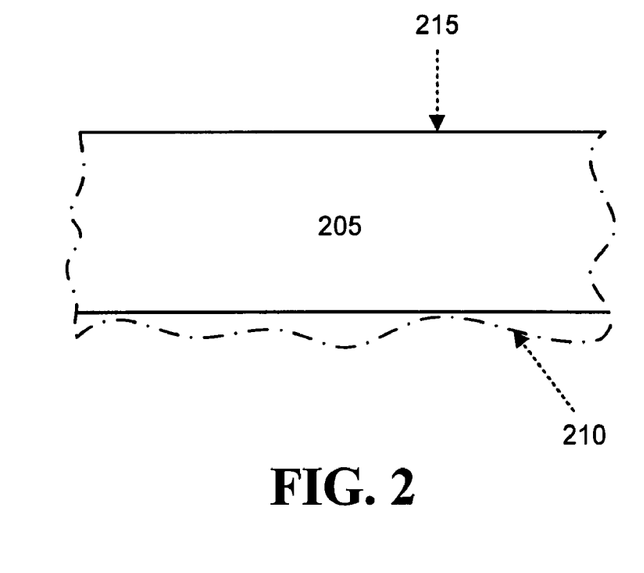
FIG. 2 illustrates the formation of a first polycrystalline silicon layer consistent with an aspect of the invention.

FIG. 2 illustrates a cross-section of a first polycrystalline silicon layer 205 formed over an underlying layer 210 according to an exemplary embodiment of the invention. Underlying layer 210 may include any type of layer used in various semiconductor devices, such as a layer of dielectric material, a metal layer, or a layer of semiconducting material. Polycrystalline silicon layer 205 may be formed, for example, using existing deposition processes. The thickness of polycrystalline silicon layer 205 may range, for example, from about 100 Å to about 3,000 Å. Layer 205 may, optionally, be processed, as appropriate, to fabricate necessary structures for the eventual semiconductor device. In one implementation, for example, such processing may include implanting dopants into layer 205 to form a gate structure. Surface 215 of layer 205 may then be cleaned using existing oxide and/or impurity removal cleaning processes. In one implementation, cleaning of surface 215 of layer 205 may include a wet clean process using hydrofluoric acid (HF).

Figure 3:
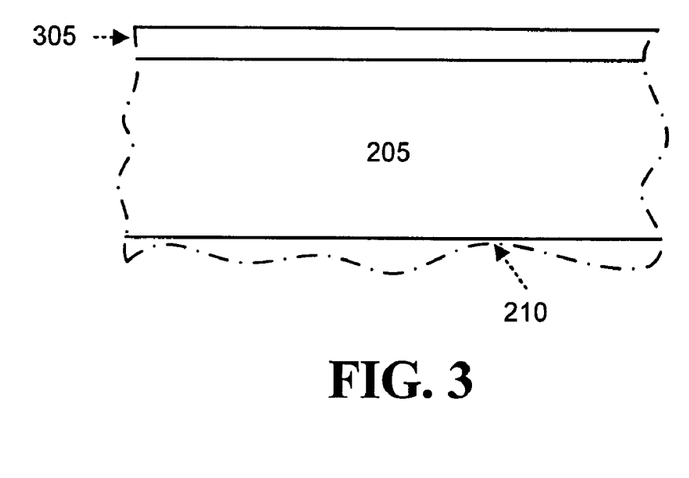
FIG. 3 illustrates the formation of an interface layer over the first polycrystalline silicon layer of FIG. 2 consistent with an aspect of the invention.

As shown in FIG. 3, an interface layer 305 may be formed on polycrystalline silicon layer 205. Interface layer 305 may include any type of metal or alloy that can react with silicon to form a silicide. For example, interface layer 305 may include titanium (Ti), cobalt (Co) or nickel (Ni), the above metals combined with other materials (e.g., CoRe, etc.), or alloys of the above metals. Interface layer 305 may be formed using, for example, existing deposition processes, though other layer formation processes may be used. The thickness of interface layer 305 may range, for example, from about 10 Å to about 500 Å.

Figure 4:
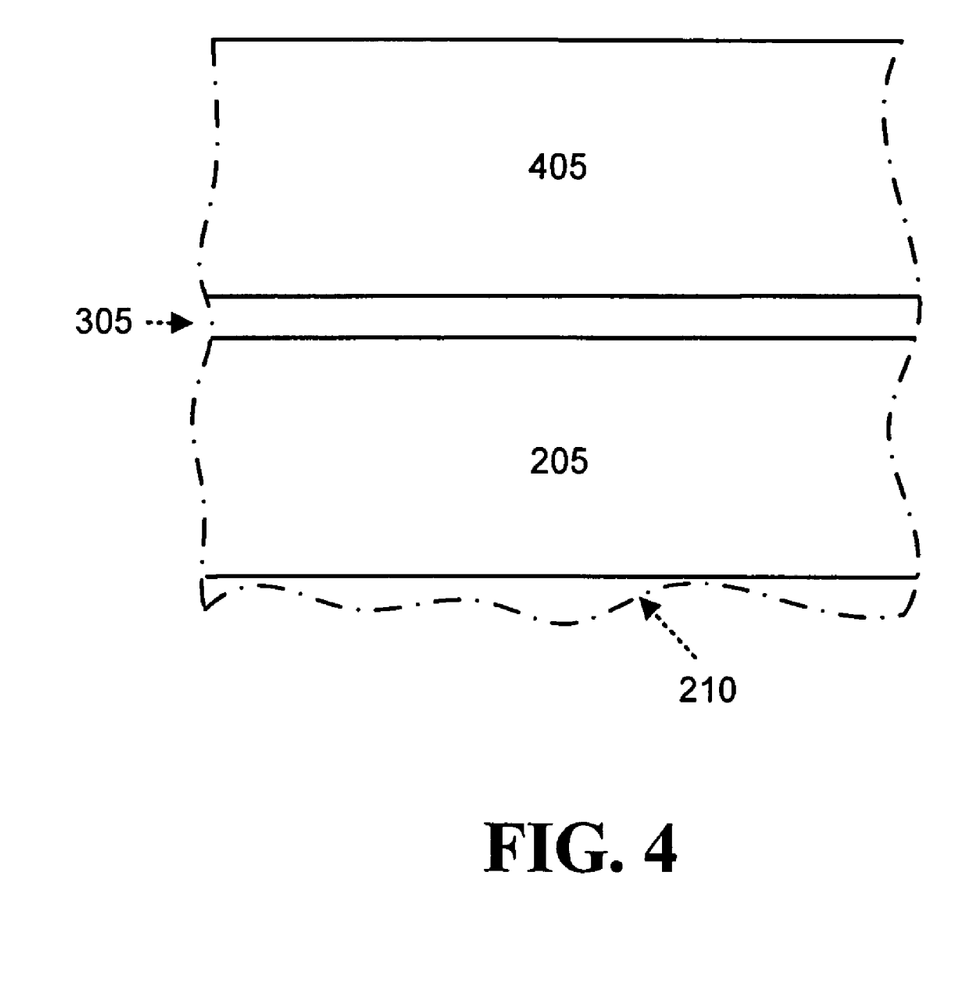
FIG. 4 illustrates the formation of a second polycrystalline silicon layer over the interface layer of FIG. 3 consistent with an aspect of the invention.

A second polycrystalline silicon layer 405 may be formed on interface layer 305, as shown in FIG. 4. Layer 405 may be formed, for example, using existing deposition processes. The thickness of polycrystalline silicon layer 405 may range, for example, from about 100 Å to about 3,000 Å.

Figure 5:
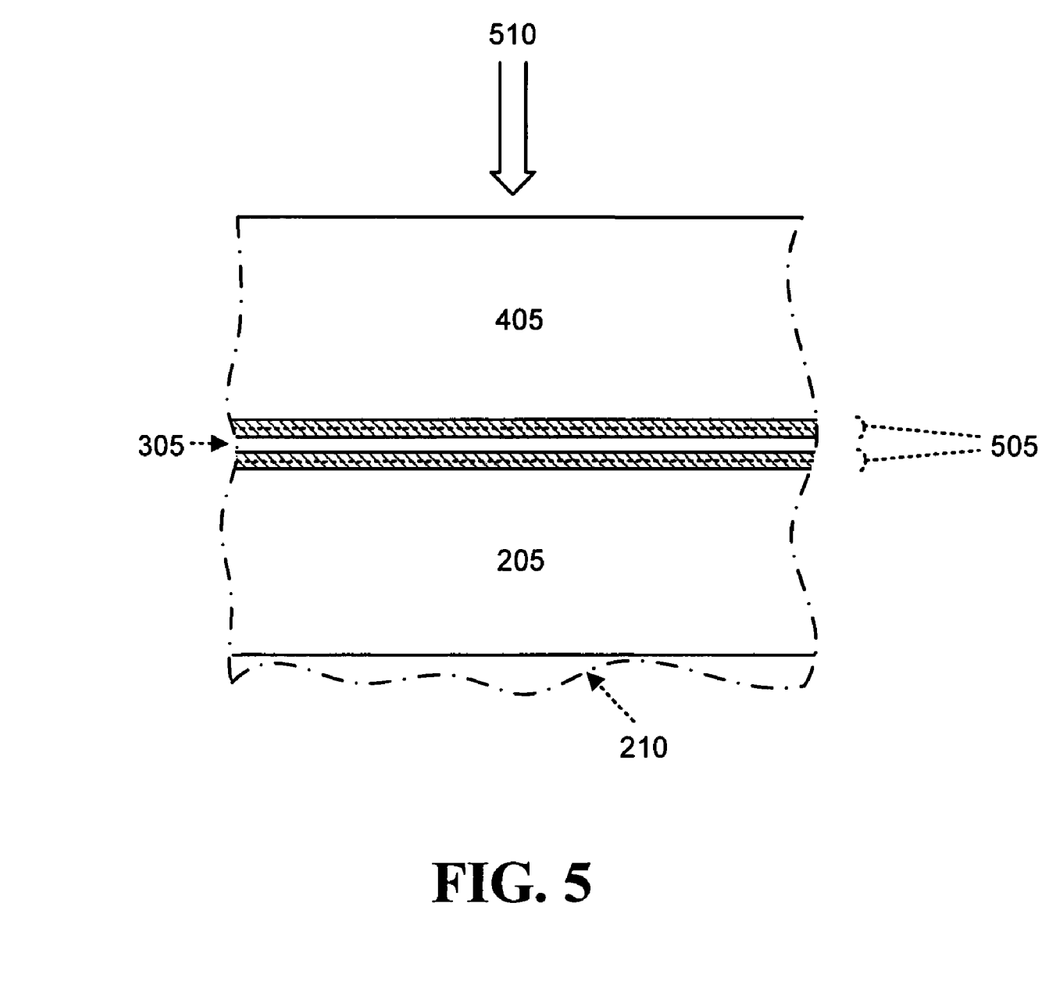
FIG. 5 illustrates the formation of silicide regions between the interface layer and polycrystalline silicon layers of FIG. 4 consistent with an aspect of the invention.

As shown in FIG. 5, subsequent to formation of layer 405, layers 205, 305 and 405 may be subjected to a thermal cycle 510 such that interface layer 305 reacts with polycrystalline silicon layers 205 and 405. The thermal cycle may range from a low temperature of about 300 degrees Celsius to a high temperature of about 900 degrees Celsius over a period of time ranging from about 1 second to about 12 hours. The thermal cycle 510 may be inherently produced as a by-product of subsequent device fabrication processes, or may be a specifically implemented step for the purpose of reacting interface layer 305 with layers 205 and 405. Subjecting layers 205, 305 and 405 to the thermal cycle may cause the polycrystalline silicon in layers 205 and 405 to react with the material of interface layer 305 to form silicide regions 505 between interface layer 305 and each of layers 205 and 405. For example, if interface layer 305 includes titanium, thermal cycling produces silicide regions 505 that include titanium silicide (TiSi). If interface layer 305 includes cobalt, thermal cycling produces silicide regions 505 that include cobalt silicide (CoSi). If interface layer 305 includes nickel, thermal cycling produces silicide regions 505 that include nickel silicide (NiSi). Silicide regions 505 may be formed to a thickness ranging from about 50 Å to about 1,000 Å. Layers 205 and 405 bond well to interface layer 305 and silicide regions 505, thus, providing an improved interface between dual polycrystalline silicon layers 205 and 405 that has a good electrical contact.

Figure 6A:
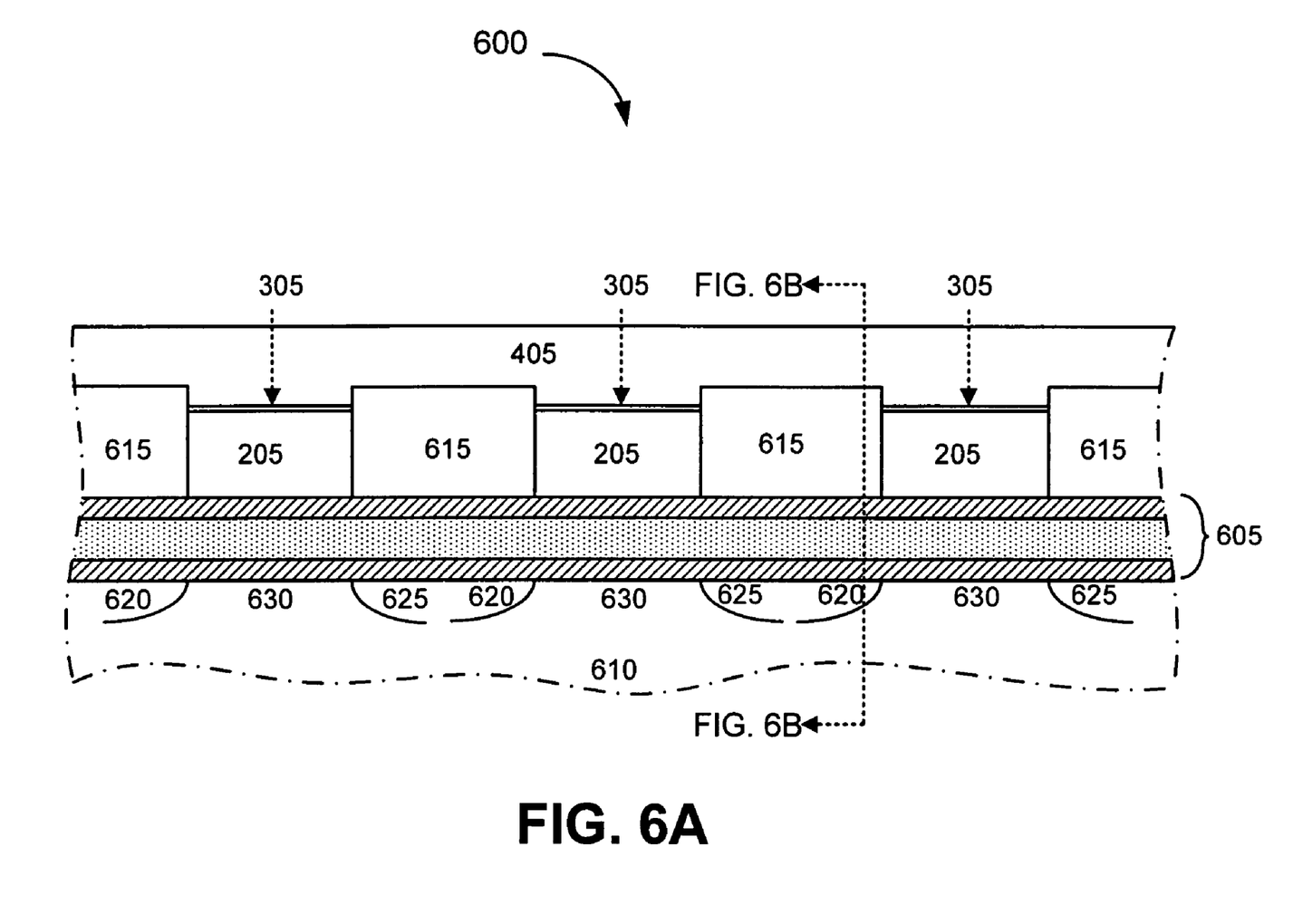
FIGS. 6A and 6B illustrate an exemplary memory device that includes the interface layer formed between the dual polycrystalline layers of FIG. 5 consistent with an aspect of the invention.
Figure 6B:
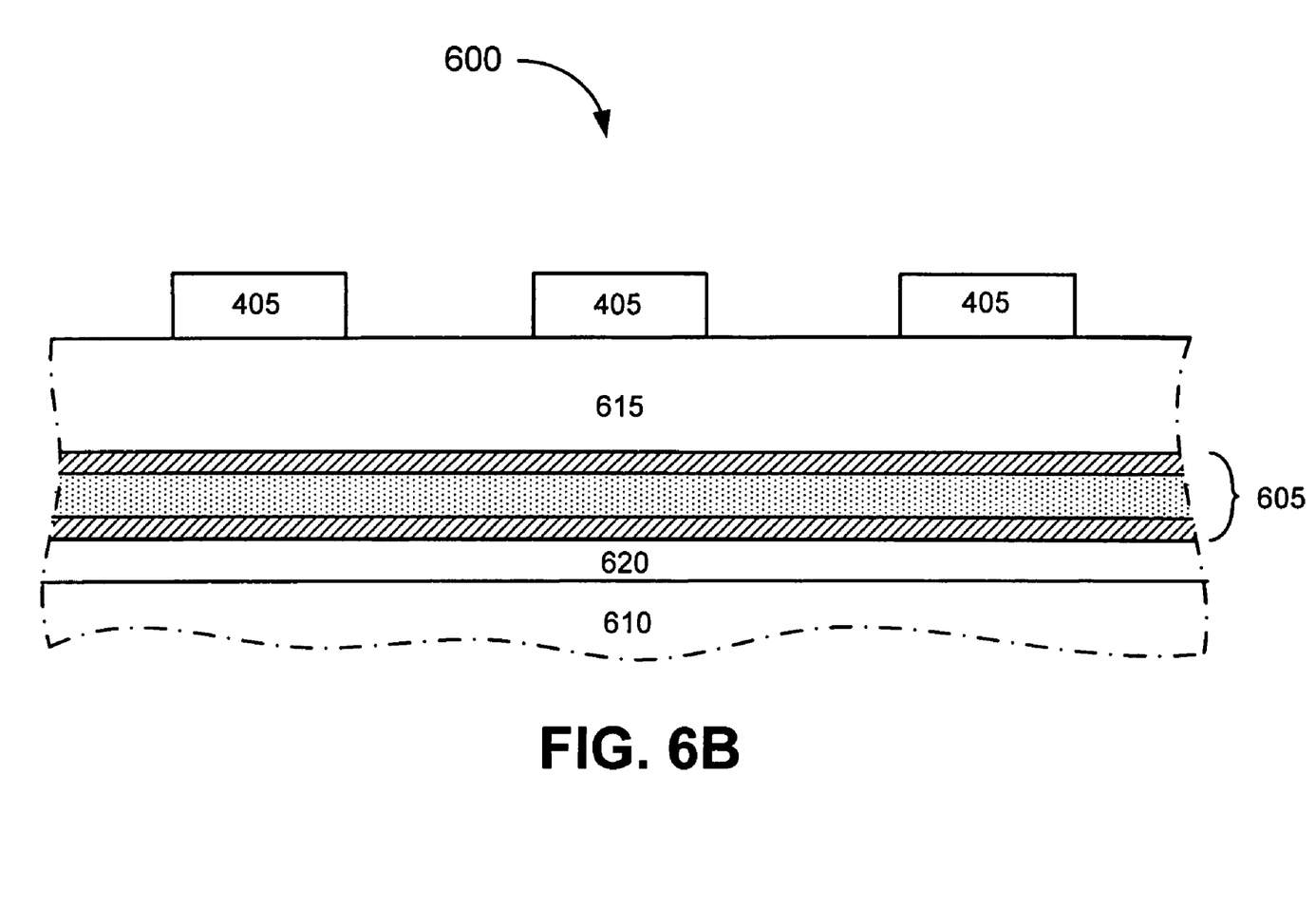

An interface layer between dual polycrystalline silicon layers, as described above with respect to FIGS. 2-5, may be used in any type of semiconductor device where it is desired to interface a first polycrystalline silicon layer with a second polycrystalline silicon layer. FIGS. 6A and 6B depict one exemplary implementation in which the interface layer of the present invention is used in an array of silicon-oxide-nitride-oxide-silicon (SONOS) type memory cells 600. As shown in FIGS. 6A and 6B, an array of memory cells 600 may include an oxide-nitride-oxide (ONO) stack 605 formed over, for example, a substrate 610. Gate structures 205, formed from a layer of polycrystalline silicon, may be formed at intervals over the ONO stack 605. A source region 620 and a drain region 625 may be formed underneath respective sides of a corresponding gate structure 205, with a channel region 630 being disposed between each source 620 and drain 625 region. Dielectric mesas 615 may be formed between gate structures 205 to insulate the gate structures 205 from one another. A layer 305, formed as described above with respect to FIGS. 2-5, may be formed over each gate structure 205 as an interface to a second layer 405 of polycrystalline silicon formed over each gate structure 205. The second layer 405 of polycrystalline silicon may form multiple wordlines for the memory array.

Substrate 610, consistent with one aspect, may include a crystal silicon wafer. In other implementations, substrate 610 may include a gallium arsenide layer, a silicon-on-insulator structure, a silicon-germanium layer, or other conventional materials used to form a semiconductor substrate. A bottom oxide of ONO stack 605 layer may be formed on substrate 610. The bottom oxide layer may be formed on substrate 610 using, for example, existing deposition processes, such as a chemical vapor deposition (CVD) process. The bottom oxide layer may include oxide materials, such as, for example, silicon oxide, or silicon oxynitride. The thickness of the bottom oxide layer may range, for example, from about 35 Å to about 70 Å.

A charge storage layer of ONO stack 605 may be formed on the bottom oxide layer using, for example, existing deposition processes, such as conventional CVD processes. In one exemplary embodiment, the charge storage layer may include a nitride charge storage layer, such as, for example, silicon nitride. In other embodiments, the charge storage layer may include other known dielectric materials such as, for example, high dielectric constant (high K) dielectric materials, that may be used to store a charge. The thickness of the charge storage layer may range, for example, from about 40 Å to about 100 Å.

A top oxide layer of ONO stack 605 may be formed on the charge storage layer using, for example, existing deposition processes, such as conventional CVD processes. The top oxide layer may include oxide materials, such as, for example, silicon oxide, or silicon oxynitride. The thickness of the top oxide layer may range, for example, from about 30 Å to about 60 Å.

A layer of gate material may be formed on the top oxide layer of ONO stack 605 using existing deposition processes. The layer of gate material may include, for example, polycrystalline silicon. The thickness of the layer may range, for example, from about 1000 Å to about 2000 Å. The layer of gate material may be etched, using existing photolithographic and etching processes to form gate structures 205.

A source region 620 and a drain region 625 may then be formed in substrate 610 adjacent each gate structure. Each source region 620 and drain region 625 may be implanted with n-type or p-type impurities based on particular end device requirements. The particular implantation dosages and energy used to implant the impurities is not described herein in order not to unduly obscure the thrust of the invention. One of ordinary skill in the art, however, would be able to optimize the formation of each source region 620 and drain region 625 based on the particular end device requirements. Formation of each source region 620 and drain region 625 creates a channel region 630 in substrate 610 between each source region 620 and drain region 625.

An interface layer 305, formed as described above with respect to FIGS. 2-5, may be formed over each gate structure 205 as an interface to a second layer 405 of polycrystalline silicon formed over each gate structure 205. The second layer 405 of polycrystalline silicon may form multiple wordlines for the memory array.

In each memory cell of FIGS. 6A and 6B, during programming, electrical charge is transferred from substrate 610 to the nitride layer in the ONO stack 605. Voltages are applied to the gate 205 and drain 620 creating vertical and lateral electric fields, which accelerate the electrons along the length of the channel 630. As the electrons move along the channel 630, some of them gain sufficient energy to jump over the potential barrier of the bottom oxide layer of ONO stack 605 and become trapped in the nitride layer of ONO stack 605. Electrons are trapped near drain region 625 because the electric fields are the strongest near drain region 625. Reversing the potentials applied to the source region 620 and drain region 625 causes electrons to travel along the channel in the opposite direction and be injected into the nitride layer near source region 620. Because the nitride is not electrically conductive, the charge introduced into the nitride layer of ONO stack 605 tends to remain localized. Accordingly, depending upon the application of voltage potentials, electrical charge can be stored in discrete regions within a single continuous nitride layer.

In the previous descriptions, numerous specific details are set forth, such as specific materials, structures, chemicals, processes, etc., in order to provide a thorough understanding of the invention. However, implementations consistent with the invention can be practiced without resorting to the details specifically set forth herein. In other instances, well known processing structures have not been described in detail, in order not to unnecessarily obscure the thrust of the invention. In practicing the invention, conventional photolithographic, etching and deposition techniques may be employed, and hence, the details of such techniques have not been set forth herein in detail.

The foregoing description of embodiments of the invention provides illustration and description, but is not intended to be exhaustive or to limit the invention to the precise form disclosed. Modifications and variations are possible in light of the above teachings or may be acquired from practice of the invention. For example, while series of acts have been described above, the order of the acts may vary in other implementations consistent with the invention.

Only the preferred embodiments of the invention and a few examples of its versatility are shown and described in the above disclosure. It is to be understood that the invention is capable of use in various other combinations and environments and is capable of modifications within the scope of the inventive concept as expressed herein. No element, act, or instruction used in the description of the application should be construed as critical or essential to the invention unless explicitly described as such. Also, as used herein, the article "a" is intended to include one or more items. Where only one item is intended, the term "one" or similar language is used. The scope of the invention is defined by the following claims and their equivalents.

What is claimed is:

1. A method, comprising:
   forming a first layer of polycrystalline silicon;
   cleaning a surface of the first layer;
   forming an interface layer over the surface of the first layer, wherein the interface layer comprises one of titanium, cobalt, or nickel;
   forming a second layer of polycrystalline silicon over the interface layer; and
   thermal cycling the first layer, interface layer and second layer to form at least one of titanium silicide, cobalt silicide or nickel silicide between at least a portion of the interface layer and portions of the first and second layers.

2. The method of claim 1, wherein thermal cycling the first layer, interface layer and second layer further comprises:
   thermal cycling the first layer, interface layer and second layer to form the at least one of titanium silicide, cobalt silicide and nickel silicide to a thickness ranging from about 50 Å to about 1,000 Å.

3. The method of claim 1, wherein forming an interface layer comprising:
   forming the interface layer to a thickness ranging from about 10 Å to about 500 Å.

4. The method of claim 1, wherein forming the interface layer comprises:
   depositing the titanium, cobalt or nickel over the surface of the first layer.

5. A method of forming an interface between dual polycrystalline silicon layers, comprising:
   forming a first layer of polycrystalline silicon;
   forming a metal interface layer on the first layer of polycrystalline silicon, wherein the metal interface layer comprises at least one of titanium (Ti), cobalt (Co) or nickel (Ni); and
   forming a second layer of polycrystalline silicon on the metal interface layer; and
   thermal cycling the first layer, metal interface layer and second layer to form at least one of titanium silicide (TiSi), cobalt silicide (CoSi) or nickel silicide (NiSi) between at least a portion of the metal interface layer and portions of the first and second layers.

6. The method of claim 5, wherein forming a metal interface layer comprises:
   forming the metal interface layer to a thickness ranging from about 10 Å to about 500 Å.

7. The method of claim 5, wherein forming the metal interface layer comprises:
   depositing the titanium, cobalt or nickel over the first layer.

8. The method of claim 5, further comprising:
   cleaning a surface of the first layer prior to forming the interface layer on the first layer.

9. A method, comprising:
   forming a first layer of polycrystalline silicon;
   forming a metal interface layer on the first layer of polycrystalline silicon;
   forming a second layer of polycrystalline silicon on the metal interface layer; and
   thermal cycling the first layer, metal interface layer and second layer to form a metal silicide between at least a portion of the metal interface layer and portions of the first and second layers.

10. The method of claim 9, wherein the metal interface layer comprises a metal, a metal alloy, or a combination of metals or metal alloys.

11. The method of claim 10, wherein the metal interface layer comprises at least one of titanium (Ti), cobalt (Co) or nickel (Ni).

* * * * *

UNITED STATES PATENT AND TRADEMARK OFFICE
CERTIFICATE OF CORRECTION

| | | |
|---|---|---|
| PATENT NO. | : 7,256,141 B1 | Page 1 of 1 |
| APPLICATION NO. | : 11/135492 | |
| DATED | : August 14, 2007 | |
| INVENTOR(S) | : Mark T. Ramsbey et al. | |

It is certified that error appears in the above-identified patent and that said Letters Patent is hereby corrected as shown below:

At column 6, line 22, claim 5, "and" should be removed.

Signed and Sealed this

Thirtieth Day of October, 2007

JON W. DUDAS
*Director of the United States Patent and Trademark Office*